United States Patent [19]

McCarthy

[11] 4,230,794
[45] Oct. 28, 1980

[54] IMPROVING ETCH RESISTANCE OF A CASEIN-BASED PHOTORESIST

[75] Inventor: Donald C. McCarthy, Delran, N.J.

[73] Assignee: RCA Corporation, New York, N.Y.

[21] Appl. No.: 21,325

[22] Filed: Mar. 16, 1979

[51] Int. Cl.³ ............................................... G03C 5/00
[52] U.S. Cl. ..................................... 430/323; 430/23; 430/313; 430/318; 430/331
[58] Field of Search ...................... 96/36, 36.2, 114.9; 430/23, 304, 313, 318, 323, 331

[56] References Cited

U.S. PATENT DOCUMENTS

| 3,186,847 | 6/1965 | Willems et al. | 96/114.9 |
| 3,186,848 | 6/1965 | Willems et al. | 96/114.9 |
| 4,061,529 | 12/1977 | Goldman et al. | 96/36.1 |

Primary Examiner—Jack P. Brammer
Attorney, Agent, or Firm—Birgit E. Morris; Howard F. VanDenburgh

[57] ABSTRACT

The etch resistance of a casein-based photoresist pattern to low specific gravity ferric chloride based etchant solutions is increased by treating the photoresist pattern with a formaldehyde solution containing at least 10 percent formaldehyde by volume by a period of at least 30 seconds, and thereafter drying the photoresist pattern.

15 Claims, No Drawings

IMPROVING ETCH RESISTANCE OF A CASEIN-BASED PHOTORESIST

This invention relates to the manufacture of printed circuit boards. More particularly, the invention pertains to a method of improving the etch resistance of a photoresist pattern, prepared from a casein based photoresist solution, on the surface of a copper-clad substrate.

BACKGROUND OF THE INVENTION

Photosensitive etch resistant films based on aqueous solutions of natural products such as fish glue, albumin, and casein have been known for a number of years. One such useful photoresist composition comprises water, casein, made by acid precipitation of milk, an alkali metal base to impart a pH of 7.7 or higher which improves the solubility of the natural product in the water, and an ammonium dichromate sensitizer. Goldman and Datta in their U.S. Pat. No. 4,061,529 disclose the addition of sodium borate as the base in a concentration such that the photoresist solution has the final pH of 6.7–7.3, to improve the pot life of the coating composition and the shelf life of coated substrates.

These resists have been employed extensively in the lithographic printing arts and in the manufacture of shadow masks for television monitors. A cleaned metal, e.g., copper, surface or substrate is coated with the aqueous photoresist solution and dried. A mask having the desired pattern is contacted to the resist and exposed to light of an appropriate wavelength which hardens the resist in the exposed areas. The resist film is then washed with water to dissolve the unexposed resist and thereby uncover part of the metal surface. The now partially coated substrate is then dried and baked for about 5 minutes at a temperature of from about 500°–550° F. (260°–287° C.). This step is required to render the remaining photoresist etch resistant. The partially coated substrate is then etched by spraying with hot ferric chloride solution which etches away the bared metal portions. The residual resist can then be removed by hot alkali solution.

The above process has been universally adopted for television shadow mask production because of its low cost, in that the photoresist, water rinse, and caustic wash solutions are very inexpensive as compared to organic based photoresists.

However, this process has certain limitations which prevent its use in other high production manufacture which employ lithographic techniques. In particular, in the manufacture of printed circuit boards, a copper-clad substrate such as a phenolic impregnated paperboard, is etched to form a pattern of conductors to which various components are soldered. Generally, these printed circuit boards are made by screen printing an etch resistant ink onto the boards and etching the exposed metal areas. However, this method is not able to define line widths of less than about 0.025 inch (0.06 centimeter). With the increasing miniaturization of components on printed circuit boards, the need to define line widths and spacings on the order of 0.015 inch (0.04 centimeter) and smaller has occurred. Photolithographic techniques to define such fine pattern spacings must then be employed if high yields are to be maintained.

The pattern is made by applying a photoresist film over the copper layer, exposing and developing the resist to create a pattern of photoresist and exposed copper. The copper is etched away in the exposed areas and the photoresist is then removed, leaving a patterned copper layer on the board. At present, organic-based photoresists are used because the high temperatures required to cure water-based resists cannot be tolerated by the phenolic impregnated paper substrate.

One attempted method to deal with this high temperature curing problem of the water-based photoresist is disclosed by Goldman in U.S. Application Ser. No. 877,481, filed Feb. 13, 1978 now U.S. Pat. No. 4,158,566, wherein it is disclosed to use an accelerator with such water-based photoresist compositions. As an accelerator there is disclosed N-methylol acrylamide, which, when added to a casein-based photoresist composition, lowers the curing temperature required to make the photoresist etch resistant to a temperature of about 125°–135° C., and enables such compositions to be employed in printed circuit board manufacture.

Another method dealing with the etch resistance of water-based photoresists is disclosed by Dougherty in U.S. Application Ser. No. 967,793, filed Dec. 8, 1978, herein incorporated by reference, wherein it is disclosed that such photoresists are etch resistant or sufficiently etch resistant to allow the use of the same in the manufacture of printed circuit boards if certain process parameters are maintained. These parameters include the use of a minimum thickness of photoresist film, the use of a specific type of water in developing the patterned photoresist, and the use of an etchant solution having a certain minimum specific gravity.

With the continuing need for improved etch resistance in water-based photoresists, it has been found that if the photoresist pattern is treated in a specific manner prior to being exposed to the etchant solution, the photoresist attains an improved etch resistance such that etchant solutions of lower specific gravity may be used. A lower specific gravity etchant solution makes possible increases in etch rates. This increases the overall throughput in the printed circuit board manufacture.

SUMMARY OF THE INVENTION

I have now found that if a casein-based photoresist pattern is treated with a formaldehyde solution and dried prior to exposure to the etchant solution, its etch resistance is improved such that lower specific gravity ferric chloride based etchant solutions can be used in etching the circuit board containing the casein based photoresist.

DETAILED DESCRIPTION OF THE INVENTION

The invention includes the method of producing a casein-based photoresist pattern of improved etch resistance to low specific gravity ferric chloride based etchant solutions, and comprises treating a dried casein-based photoresist pattern with a formaldehyde solution and thereafter drying the exposed photoresist pattern. The formaldehyde solution treatment should last for a period of at least 30 seconds and the solution should contain at least 10 percent formaldehyde by volume.

More completely, the method of the invention may be carried out by applying a casein-based photoresist solution to a circuit board to form a photoresist film, drying the photoresist film on the circuit board to form a photoresist, exposing the dried photoresist film to actinic radiation through a photomask, developing the exposed photoresist film to leave a photoresist pattern on the circuit board, treating the photoresist pattern with a formaldehyde solution, and thereafter drying the circuit board to produce a photoresist pattern of improved etch resistance. The process may also include the further steps of etching the patterned circuit board with a ferric chloride-based etchant solution having a low specific gravity to etch those portions of the board not protected by the photoresist pattern, and stripping the residual photoresist from the circuit board in a hot alkali solution to leave a patterned copper layer on the circuit board.

The aqueous casein solutions used in the process of this invention comprise casein as the sensitizable protein material, sodium borate as the alkalizing agent for the casein, alkali dichromate photosensitizer for the casein, and water. Optionally, small amounts of a surfactant and a dye may also be added if desired. In addition to these ingredients, these solutions may also contain the accelerator N-methylol acrylamide, which may be employed in amounts of from about 3 to about 30 percent by weight of the casein present in the solution. The casein employed may be any acid precipitated casein and usually comprises from about 6 to about 12 percent by weight of the photoresist composition.

The alkalizing agent is added to solubilize the casein and is added in sufficient amount such that the pH of the final photoresist solution is from about 6.7 to about 7.3. Sodium borate is the preferred alkalizing agent in that it does not degrade the casein. Generally, amounts from about 8 to about 20 percent by weight of the casein are sufficient, but additional amounts may be required to bring the pH to the desired level.

Sodium dichromate is the preferred alkali dichromate photosensitizer as it reduces dark hardening in the casein photoresist. However, other dichromates, such as ammonium and potassium dichromate, can also be employed. The sensitizer is usually added in amounts from about 2 to about 20 weight percent of the casein present. The amount of water added to the solution is adjusted to regulate the viscosity and the thickness of the resultant photoresist coating.

These aqueous solutions can be prepared by heating deionized water to about 50°–60° C., and dissolving the sodium borate, surfactant, dye, and/or N-methylol acrylamide, if used. The casein is then added in a small but steady stream with vigorous agitation until dissolved; usually about 30 to 40 minutes is sufficient. The resultant solution is then cooled to room temperature and filtered. Just prior to use, the dichromate sensitizer is added and the pH is adjusted, if required, with sodium borate.

The aqueous solutions used in the present method can be applied to the circuit board or substrate by dipping, spin coating, roller coating, and the like. The thickness of the coated photoresist film is usually maintained in the range of from about 2 to about 7 micrometers, and preferably about 4–5 micrometers. Application of the aqueous solution may be repeated to obtain the desired thickness of the coating.

After the photoresist coating has been applied to the substrate, the same is dried, usually employing a source of infrared light. Thereafter, the photoresist is exposed to an ultraviolet light source, such as a carbon-arc, xenon, or a mercury lamp through a photomask, which exposure hardens the coating in the exposed areas. The exposed photoresist is then developed by flushing with water which removes the unexposed portions of the resist, leaving the desired pattern of photoresist film on the circuit board. After being developed and dried, the circuit board with the photoresist pattern is, according to the invention, treated with a formaldehyde solution and further dried to improve the etch resistance of the photoresist pattern. The formaldehyde solution is preferably one which contains from about 10 to about 40 percent formaldehyde by volume. The treatment or exposure of the photoresist pattern to the formaldehyde solution is one which is carried out for a period of approximately 1 minute, and preferably in the range of from about 30 to about 90 seconds. Thereafter, the circuit board and photoresist pattern thereon is dried, which drying is preferably carried out in an oven. Most preferably, the drying will be an oven drying at about 70° C. and carried out for a period of about 10 minutes.

The process of the invention may be further carried out by etching the exposed portions of the copper on the circuit board with a ferric chloride based etchant solution having a low specific gravity to etch away those portions of the copper metal not protected by the patterned etch resistant coating. The preferred etchant for use in the method of the invention will have a specific gravity below 1.40, and more preferably between about 1.34 and 1.36. Following etching, the remaining photoresist on the substrate may be removed by a warm, dilute, basic solution, e.g., aqueous 2 to 10 percent by weight sodium hydroxide, at 50°–80° C., to leave a patterned copper layer on the circuit board.

In order to illustrate the invention and the improved process thereof with greater particularity, the following specific examples are included. These examples are intended to illustrate the invention only and are not intended to limit the same in any way.

EXAMPLE I

A circuit board having a copper-clad substrate was pretreated to clean the metal surface thereof by the use of a physical abrasion process. Coincidental therewith, an aqueous based photoresist solution was prepared, as set forth above, using deionized water and casein as the sensitizable material in an amount of about 10 percent by weight of the resultant resist composition. Additionally added to the solution were sodium borate alkalizing agent in the amount of about 1.3 weight percent, sodium dichromate photosensitizer in the amount of about 0.3 weight percent, Rhodamine B dye in the amount of about 0.05 weight percent, and a surfactant in the amount of about 0.1 weight percent. This solution was coated onto the copper surface of the circuit board by the curtain-coating technique. The resultant photoresist film was air dried at room temperature. The dried photoresist coating was then exposed through a photomask for about 30 seconds to a mercury arc lamp, thereafter developed with a water spray and, finally, once again dried to leave a pattern of photoresist on the circuit board.

The circuit board was next soaked for a period of approximately 1 minute in a 40 percent (by volume) solution of formaldehyde and then oven dried at approximately 70° C. for a period of about 10 minutes. After the formaldehyde treatment and drying, the etching of the circuit board was carried out with a ferric chloride based etchant solution having a specific gravity of approximately 1.38 at about 53° C. Following etching, the remaining resist coating was stripped with warm, dilute sodium hydroxide, leaving a patterned copper layer on the circuit board.

An additional circuit board was prepared as set forth above but without the formaldehyde solution treatment. The photoresist pattern on the circuit board failed, in that it became hydrophilic and swelled when wet, when attempting to etch the exposed copper layer of the board in the ferric chloride based etchant solution.

EXAMPLE II

A circuit board was prepared as in Example I using the photoresist solution of Example I with the exception that the sodium borate alkalizing agent was used in an amount of about 1.0 weight percent, and additionally, the accelerator N-methylol acrylamide was employed in an amount of about 0.3 weight percent. The formaldehyde solution treatment was carried out for 30 seconds in a 20 percent (by volume) formaldehyde solution, followed by a drying of the circuit board in an oven at approximately 71° C. for a period of about 10 minutes. The photoresist pattern gave excellent results when the circuit board was etched in a ferric chloride based etchant solution having a specific gravity of approximately 1.34–1.38, thus indicating an enhanced or improved etch resistance of the photoresist pattern.

CONTROL 1

In this example a circuit board was prepared as in Example I with the following exception. The formaldehyde treatment was carried out in a 20 percent (by volume) formaldehyde solution for a period of approximately 5 seconds. After this treatment, the circuit board was oven dried at approximately 70° C. for about 10 minutes. When this circuit board was etched in the ferric chloride based etchant solution of Example I, the patterned photoresist showed breakdown and failure in the etchant bath, indicating that the 5 second formaldehyde solution treatment was insufficient to effectively enhance or increase the etch resistance of the photoresist pattern.

CONTROL 2

In this example a circuit board was prepared having a desired pattern of photoresist thereon as in Example I. Thereafter, the circuit board with photoresist pattern was treated in a 10 percent (by volume) solution of formaldehyde for a period of 1 minute. This was then followed by a partial air drying of the circuit board in lieu of the oven drying as set forth in the previous examples. When etching of this circuit board was attempted in the low specific gravity ferric chloride based etchant bath, the patterned photoresist failed in that it became hydrophilic and swelled when wet. The photoresist peeled from the circuit board when the same was later dried. This example indicates that the photoresist needs to be completely dried after the formaldehyde solution treatment prior to the etching of the circuit board. Additionally, it has been found that this drying is preferably an oven drying and one which is carried out at approximately 70° C.

I claim:

1. A method of improving the etch resistance of a casein-based photoresist pattern to a low specific gravity ferric chloride based etchant solution comprising, treating a dried casein-based photoresist pattern with a formaldehyde solution, and thereafter drying the treated photoresist pattern.

2. The method as set forth in claim 1 including the further step of exposing said photoresist pattern to a ferric chloride based etchant solution having a specific gravity below about 1.40.

3. The method as set forth in claim 2 wherein said etchant solution has a specific gravity of between about 1.34 and about 1.36.

4. The method as set forth in claim 2 including the further step of stripping the remaining photoresist pattern by treating with a hot alkali solution.

5. The method as set forth in claim 1 wherein said formaldehyde solution contains from about 10 to about 40 percent formaldehyde by volume.

6. The method as set forth in claim 5 wherein said treatment is carried out for a period of from about 30 to about 90 seconds.

7. The method as set forth in claim 1 wherein said photoresist pattern is produced from a solution including acid precipitated casein, alkali dichromate photosensitizer for said casein, sodium borate as alkalizing agent, and water.

8. In a method of producing a photoresist pattern of improved etch resistance on a circuit board, including the steps of:
 (a) applying a casein-based photoresist solution to a circuit board to form a photoresist film;
 (b) drying said photoresist film on said circuit board to form a photoresist;
 (c) exposing said dried photoresist film to actinic radiation through a photomask;
 (d) developing said exposed photoresist film to thereby leave a pattern of photoresist film on said circuit board; the improvement comprising the additional steps of,
 (e) treating said phtotoresist pattern with a formaldehyde solution to improve its etch resistance; and
 (f) thereafter drying said circuit board.

9. The method as set forth in claim 8 including the further step of etching said patterned circuit board with a ferric chloride based etchant solution having a specific gravity below about 1.40.

10. The method as set forth in claim 8 wherein said drying after said formaldehyde treatment is an oven drying.

11. The method as set forth in claim 9 wherein said etchant solution has a specific gravity of between about 1.34 and about 1.36.

12. The method as set forth in claim 9 including the further step of stripping the residual photoresist film from said circuit board in a hot alkali solution.

13. The method as set forth in claim 8 wherein said formaldehyde solution contains from about 10 to about 40 percent formaldehyde by volume.

14. The method as set forth in claim 13 wherein said treatment is carried out for a period of from about 30 to about 90 seconds.

15. The method as set forth in claim 8 wherein said casein based solution includes acid precipitated casein, alkali dichromate photosensitizer for said casein, sodium borate as alkalizing agent, and water.

* * * * *